US 6,728,099 B1

(12) United States Patent
Tsang et al.

(10) Patent No.: US 6,728,099 B1
(45) Date of Patent: Apr. 27, 2004

(54) ELECTRICAL COMPONENT HAVING A HYBRID AIR COOLING SYSTEM AND METHOD

(75) Inventors: Victoria M. Tsang, Davis, CA (US); Michal P. Warzecha, Roseville, CA (US); Mike T. Strickler, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/191,964

(22) Filed: Nov. 13, 1998

(51) Int. Cl.$^7$ .................................................. H05K 7/20
(52) U.S. Cl. ........................ 361/678; 361/695; 454/187
(58) Field of Search .................... 454/184; 361/678, 361/695

(56) References Cited

U.S. PATENT DOCUMENTS

| 2,824,939 A | * | 2/1958 | Claybourn et al. ..... 361/678 X |
| 5,168,424 A | * | 12/1992 | Bolton et al. ............ 361/695 |
| 5,207,613 A | * | 5/1993 | Ferchau et al. ........... 454/184 |
| 5,540,548 A | * | 7/1996 | Eberhardt et al. ...... 454/184 X |
| 5,546,272 A | * | 8/1996 | Moss et al. ............ 361/695 X |
| 5,772,500 A | * | 6/1998 | Harvey et al. ............ 454/184 |
| 5,813,243 A | * | 9/1998 | Johnson et al. ........ 361/695 X |

FOREIGN PATENT DOCUMENTS

SU           984088    * 12/1982 .................. 454/696

* cited by examiner

Primary Examiner—Harold Joyce

(57) ABSTRACT

An electrical component having a hybrid air cooling system. The electrical component comprises an air plenum that extends across the width of the component and a first set of air movers that is positionable in a first lateral position downstream of the air plenum within the component enclosure and a second set of air movers that is positionable in a second lateral position downstream of the air plenum within the component enclosure. The first and second sets of air movers each include at least two air movers arranged adjacent each other in series. When both positioned in the component enclosure, the first and second sets of air movers are arranged in parallel such that both serial and parallel air flows are provided within the component enclosure to dissipate heat generated therein.

20 Claims, 4 Drawing Sheets

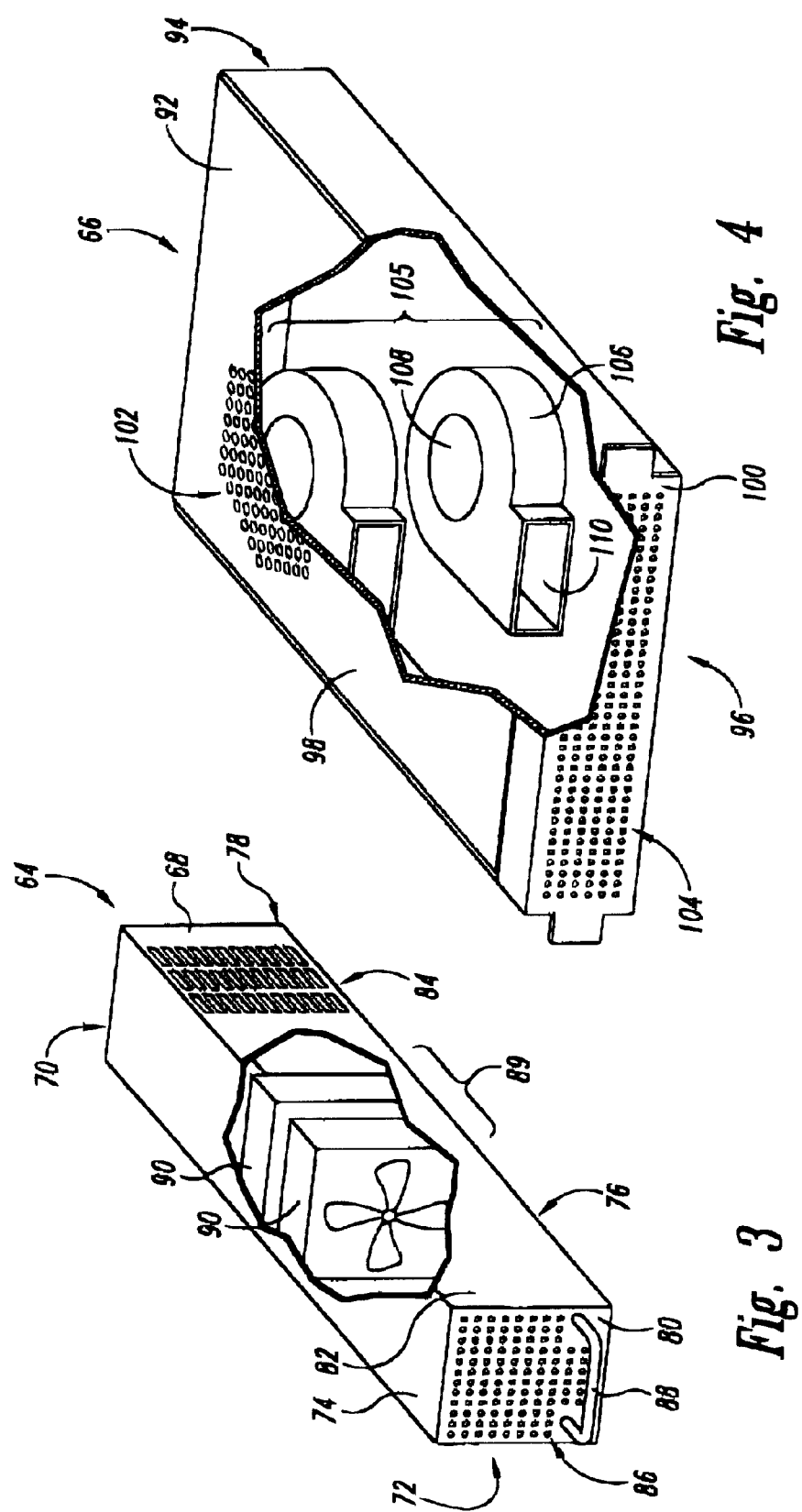

ELECTRICAL COMPONENT HAVING A HYBRID AIR COOLING SYSTEM AND METHOD

FIELD OF THE INVENTION

The invention relates generally to an electrical component having a hybrid air cooling system and method. More particularly, the invention relates to an electrical component using redundant serial and parallel air flows to dissipate heat generated within the electrical component.

BACKGROUND OF THE INVENTION

Data storage components typically comprise a plurality of data storage devices, such as disk drives, that mount within a component enclosure. The data storage devices operate at high speeds, generating relatively large amounts of heat that must be dissipated to ensure proper functioning of the devices. Recently, sufficient heat dissipation in such systems has become increasing difficult to achieve due to the current trend toward increased packing density of the data storage devices within the component enclosures. Extremely high packing density increases the amount of heat generated within the system and similarly increases the difficulty of tailoring effective cooling systems to remove this heat.

Conventional data storage systems typically use forced air convection to remove heat generated by the data storage devices within the system. Normally, each data storage component includes a plurality of air movers, such as fans, which draw ambient air over the data storage devices contained within the enclosure and expel the heated air from the component to the ambient air. The air movers are usually arranged in parallel along the rear of the component enclosure such that, if one of the air movers were to fail, one or more other air movers still operate to remove heat generated within the component. When an air mover fails in such systems, however, flow through the adjacent exhaust outlet can reverse due to the influence of the other, still functioning, air movers within the component. In that this reverse air flow can interfere with the airflow within the component enclosure to significantly inhibit the heat dissipation capacity of the cooling system, conventional components often are provided with flapper doors which automatically close when an adjacent air mover fails, to prohibit the flow of air through the exhaust outlet and back into the component enclosure.

Although typically providing enough cooling to the data storage devices when each of the air movers is operating correctly, conventional cooling systems of the type described above do not adequately dissipate heat from the data storage devices when one or more of the air movers fails. In particular, when an air mover fails and its adjacent flapper door closes, air flow within the component in the vicinity of the closed flapper door is greatly reduced, resulting in a concomitant reduction in heat dissipation from the data storage devices in that portion of the component. If the nonfunctioning air mover is not replaced quickly, one or more of the storage devices could overheat, resulting in lost information and even permanent damage to the device. Even when air mover failure is quickly detected, replacement normally requires shut-down of the entire data storage component in that the air movers are not placed in a convenient position for online replacement.

From the above, it can be appreciated that it would be desirable to have an electrical component that includes a cooling system which solves the above-identified problems.

SUMMARY OF THE INVENTION

Briefly described, the present invention relates to an electrical component having a hybrid air cooling system. The electrical component comprises a component enclosure including front and rear ends and an air plenum that extends across the width of the component enclosure between the front and rear ends. The component further comprises a first set of air movers positioned in a first lateral position downstream of the air plenum within the component enclosure and a second set of air movers positioned in a second lateral position downstream of the air plenum within the component enclosure such that the first and second sets of air movers are arranged in parallel with each other within the component enclosure. The first and second sets of air movers each typically comprise at least two air movers arranged directly adjacent each other in series. Arranged in this manner, the first and second sets of air movers provide both serial and parallel air flows within the component enclosure to dissipate heat generated therein.

In addition, the invention relates to a method of dissipating heat generated within an electrical component that has a component enclosure including front and rear ends and an air plenum that extends across the width of the component enclosure between the front and rear ends. The method comprises the steps of providing a first set of air movers arranged adjacent each other in series in a first lateral position downstream of the air plenum within the component enclosure and providing a second set of air movers arranged adjacent each other in series in a second lateral position downstream of the air plenum within the component enclosure, wherein the first set of air movers is arranged in parallel with the second set of air movers within the component enclosure such that both serial and parallel air flow is provided within the component enclosure to dissipate heat generated therein.

The particular objects, features, and advantages of this invention will become more apparent upon reading the following specification, when taken in conjunction with the accompanying drawings. It is intended that all such additional features and advantages be included therein with the scope of the present invention, as defined by the claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention. In the drawings, like reference numerals designate corresponding parts throughout the several views.

FIG. 3 is a fragmentary, rear perspective view of a power supply module used in the data storage component shown in FIGS. 1–2.

FIG. 4 is a fragmentary, rear perspective view of an air mover pack used in the data storage component shown in FIGS. 1–2.

DETAILED DESCRIPTION

Figure 1:
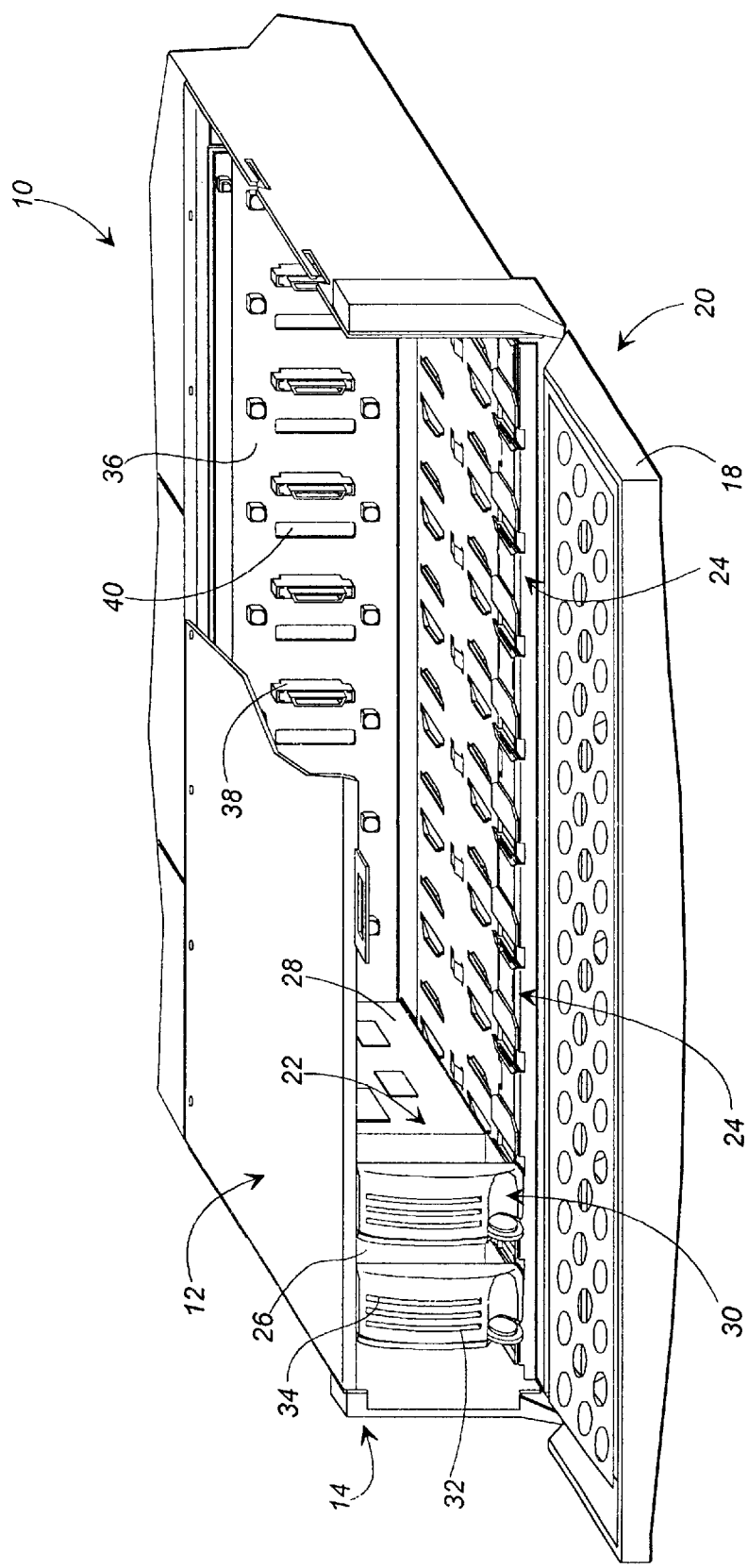
FIG. 1 is a front perspective view of a data storage component constructed in accordance with the present invention including a plurality of data storage modules inserted therein.
Figure 2:
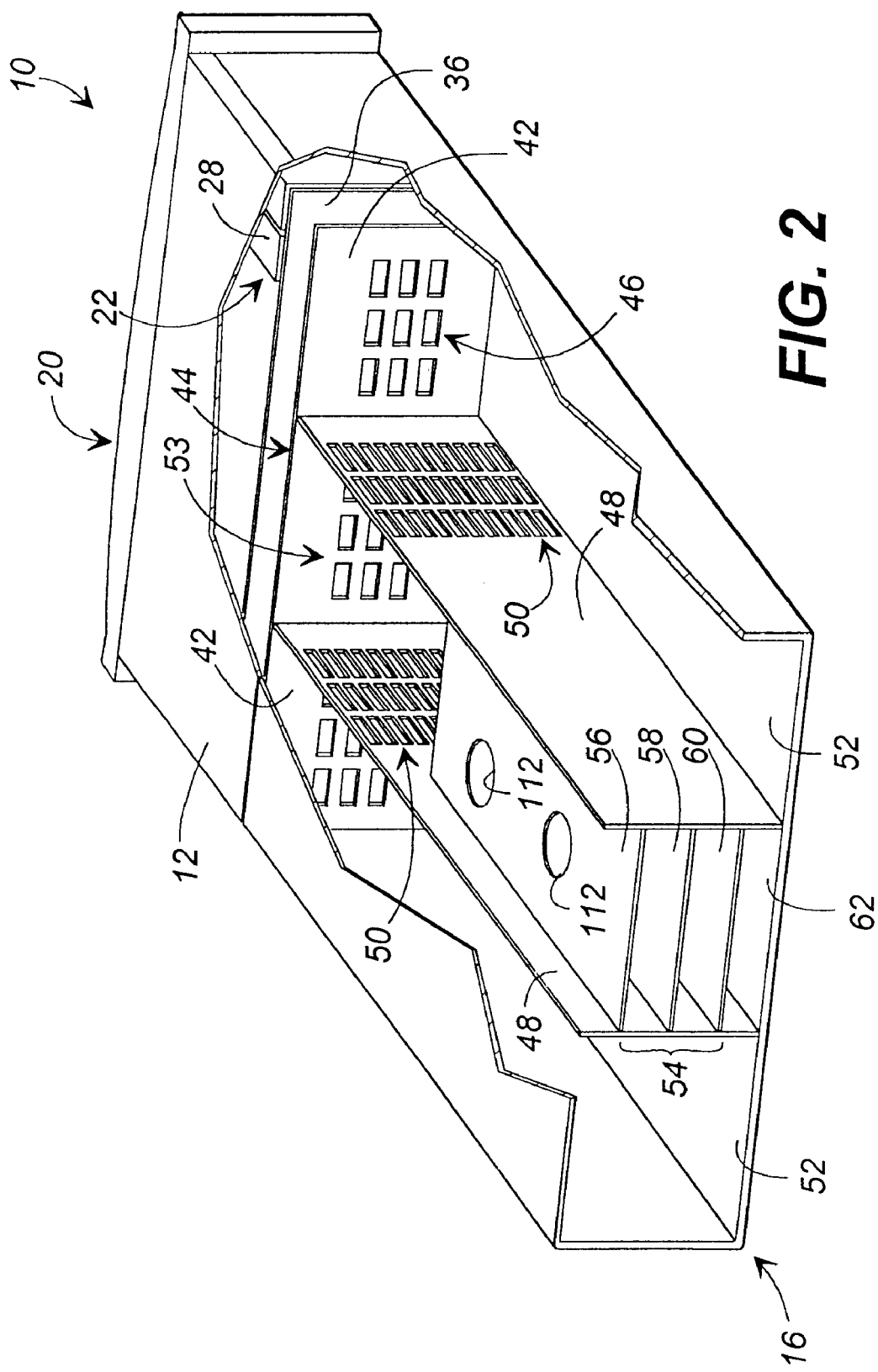
FIG. 2 is a fragmentary, rear perspective view of the data storage component shown in FIG. 1.

Referring now in more detail to the drawings, in which like reference numerals indicate corresponding parts throughout the several views, FIGS. 1–2 illustrate an electrical component 10 having a hybrid air cooling system constructed in accordance with the present invention. Typically, the electrical component 10 is a data storage component. Although the component 10 is described herein as a data storage component, it is to be understood that the component could be any electrical component that internally generates heat that is to be dissipated.

The electrical component 10 comprises a substantially rectilinear enclosure 12 having front and rear ends 14 and 16. Pivotally mounted at the front end 14 of the component enclosure 12 is an enclosure door 18 which provides access to a data storage module enclosure 20. As indicated most clearly in FIG. 1, the module enclosure 20 is adapted to receive a plurality of data storage modules 22 in a plurality of bay slots 24. As is further apparent from FIG. 1, the modules 22 are tightly packed within the module enclosure 20 such that only small air spaces 26 separate one data storage module from the next.

Each data storage module 22 generally comprises a data storage device 28, such as a disk drive, and a module carrier 30. As indicated in FIG. 1, the module carrier 30 is arranged such that the data storage device 28 is exposed to the ambient air. This open air configuration improves heat transfer from the data storage devices 28. Mounted at the front of each module carrier 30 is a bezel 32 which includes a plurality of air inlets 34.

Positioned inside the module enclosure 20 is a main circuit board generally referred to as a backplane 36. The backplane 36 includes a plurality of electrical connectors 38, such as multiple pin connectors, and a plurality of airflow openings 40. Typically, there is one electrical connector 38 and one airflow opening 40 aligned with each bay slot 24 of the module enclosure such that each data storage module 22 aligns with its own electrical connector and airflow opening.

With reference to FIG. 2, the data storage component 10 further comprises a transverse wall 42 which spans the width of the data storage component. As shown in the figure, the transverse wall 42 is oriented substantially parallel to the backplane 36. Together, the backplane 36 and the transverse wall 42 define a first air plenum 44 which, as discussed below, serves to balance the airflow along the width of the component. The transverse wall 42 includes a plurality of airflow openings 46 that typically are positioned so as to be aligned with the airflow openings 40 of the backplane 36 to enable air to flow from module enclosure 20, through the backplane air openings 40 into the first air plenum 44, and then through the transverse wall airflow openings 46.

Extending from the transverse wall 42 to the end of the component enclosure 12 are longitudinal walls 48. Normally, there are two such longitudinal walls 48 that are arranged in parallel with one another within the component enclosure 12. At the front end of the longitudinal walls 48 is a plurality of perforations 50 which, like the airflow openings 46 of the transverse wall 42, permit air to flow therethrough. Together, the longitudinal walls 48, the transverse wall 42, and the walls of the component enclosure 12 define power supply module housings 52. Similarly, the transverse wall 42, the longitudinal walls 48, and the walls of the component enclosure define a second air plenum 53. Extending between the longitudinal walls 48 in substantially parallel planes is a plurality of trays 54 that, together with the longitudinal walls define, in descending order, a first daughter board housing 56, a first air mover pack housing 58, a second air mover pack housing 60, and a second daughter board housing 62.

FIGS. 3 and 4 depict a power supply module 64 and a modular air mover pack 66, respectively, which are adapted to be slidably inserted into one of the power supply module housings 52 and one of the air mover pack housings 58 or 60, respectively. As shown in FIG. 3, the power supply module 64 comprises a substantially rectilinear enclosure 68 that includes front and rear ends 70 and 72 and a top side 74, a bottom side 76, a front side 78, a rear side 80, and opposed lateral sides 82. At the front end 70 of the enclosure 68 is a plurality of perforations 84. Normally, these perforations 84 are provided on the front and lateral sides 78 and 82 of the enclosure 68 and together form an air inlet. Similarly, the rear end 72 of the enclosure 68 is provided with a plurality of perforations 86. These perforations 86 are normally formed on the rear side 80 of the enclosure and to form an exhaust outlet. Attached to the rear side 80 of the module 64 is a handle 88 which facilitates insertion and removal of the module 64 into the component enclosure 12. Mounted within the power supply module 64 is a set 89 of at least two air movers 90. As indicated in FIG. 3, the air movers 90 typically take the form of axial fans which are mounted directly adjacent each other in series such that the forward-most air mover exhausts towards the rearward-most air mover.

When the power supply module 64 is slidably received within the power supply module housing 52 of the component enclosure 12, the perforations 84 of the power supply module 64 are positioned adjacent to the airflow openings 46 of the component transverse wall 42 and the perforations 50 of one of the component longitudinal walls 48. Arranged in this manner, air flowing from the front of the component enclosure 12 to the rear of the enclosure can pass through the transverse wall 42 and into the power supply module 64 where it is drawn rearwardly by the air movers 90 positioned therein until finally being exhausted out from the power supply module through its exhaust outlet.

As illustrated in FIG. 4, the air mover pack 66 comprises a substantially rectilinear enclosure 92 that includes front and rear ends 94 and 96, and at least top and rear sides 98 and 100. The top side 98 is provided with at least one perforated area 102 which forms an air inlet. In addition, the rear side 100 of the enclosure 92 is provided with a plurality of perforations 104 which form an exhaust outlet. Mounted inside the pack enclosure 92 is a set 105 of at least one air mover 106. Normally, two such air movers 106 are arranged directly adjacent each other in series, each being formed as a centrifugal fan having an inlet port 108 and an exhaust port 110. The air movers 106 are positioned within the enclosure 92 such that the inlet ports 108 are aligned with one of the perforated areas 102 of the enclosure and the outlet ports 110 face the perforations 104 of the rear side 100 of the enclosure. Arranged in this manner, the air movers 106 can draw in air from outside the enclosure 92 through the perforated areas 102 and expel it from the enclosure through the perforations 104.

When disposed in its air mover pack housing 58 or 60, each air mover pack 66 is positioned such that the perforated areas 102 are aligned with inlet openings 112 provided in the trays 54 of the data storage component 10. In the embodiment depicted in the figures, the top and bottom trays are provided with these inlet openings such that the air mover packs 66 can be inserted in the first and second air mover pack housings 58 and 60. When placed within the component enclosure 12 in this manner, the air movers 106 of the first and second packs 66 can draw air from the second air plenum 53, over the first and second daughter board housings 56 and 62, respectively, to exhaust this air from the rear end 16 of the component enclosure 12.

Figure 5:
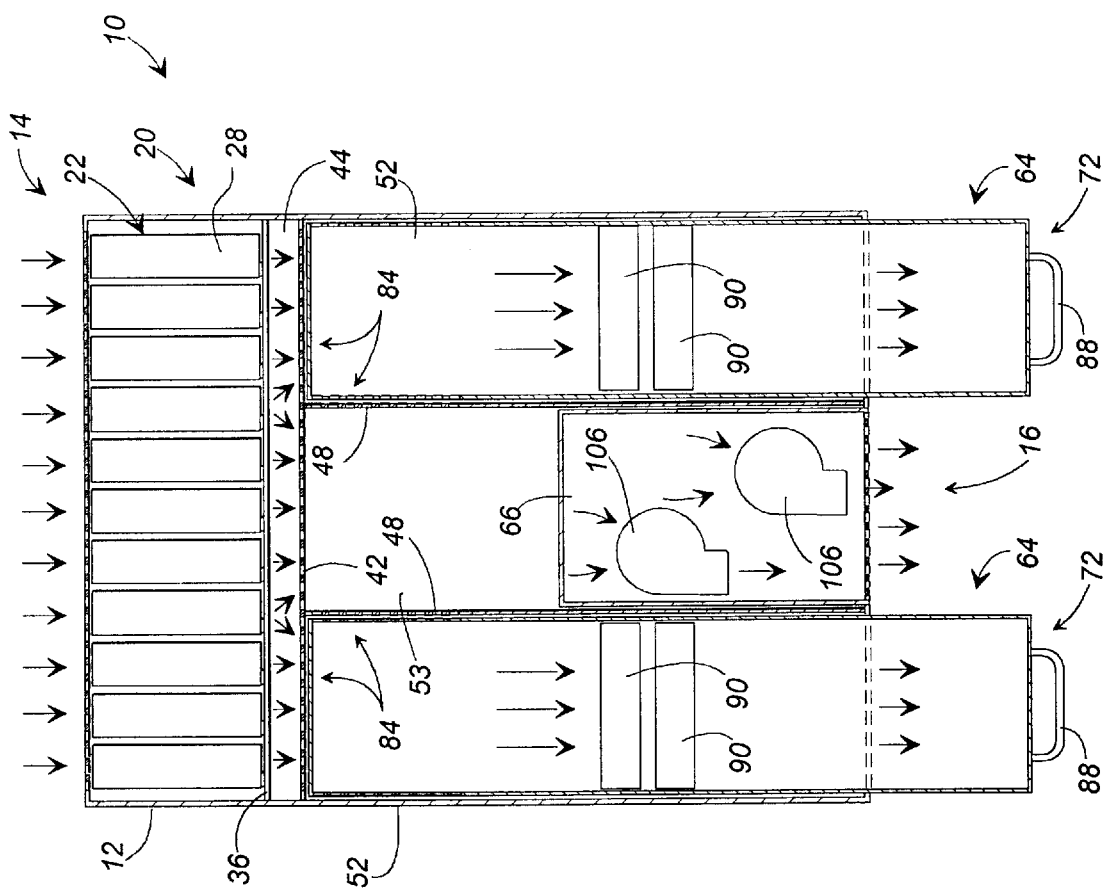
FIG. 5 is a schematic view of the data storage component shown in FIGS. 1–2 depicting the pattern of airflow within the component.

The primary structural features of the invention having been described above, air cooling of the component 10 will be discussed with general reference to FIGS. 1–4 and with particular reference to FIG. 5. When the electronic component 10 is operating, ambient air is drawn into the component enclosure 12 through the front end 14 of the enclosure. In particular, this air is drawn into the module enclosure 20 through the air inlets 34 provided in the bezels 32 of the data storage modules 22 by the air movers 90 and 106 positioned within the component enclosure 12. Once inside the module enclosure 20, the air flows past the data storage devices 28 and through the backplane airflow openings 40 into the first air plenum 44. Because of the open air configuration of the data storage devices 28, an adequate amount of heat is transferred from the devices to the airflow despite the extremely close packing of the modules 22 within the module enclosure 20.

Once inside the first air plenum 44, the airflow is balanced such that a generally equal air pressure distribution is obtained across the width of the component enclosure interior. From this point, the air is drawn through the airflow openings 46 provided in the transverse wall 42 and into the power supply module housings 52 and the second air plenum 53. At this point, the airflow is divided along four different paths. A portion of the air is drawn into the power supply modules 64 through the perforations 84 formed in the front end 70 of the power supply module enclosure 68. Once inside the power supply modules 64, the air is drawn through the air movers 90 mounted therein and then expelled out from the power supply module rear ends 72. A portion of the air in the second air plenum is drawn past first and second daughter boards (not shown) positioned within the first and second daughter board housings 56 and 62, through the inlet openings 112 provided in the trays 54, through the perforated areas 102 of the air mover packs 66, and into an air mover 106 to be expelled from the rear end 16 of the component housing 12.

As indicated above and in the figures, each air mover is used in conjunction with a similar air mover such that there is air mover redundancy. Constructed in this manner, adequate heat dissipation can be obtained even if one of the air movers fails. For example, if one of the air movers 90 disposed within the power supply module 64 were to fail, the other air mover 90 would still operate to draw and exhaust the cooling air within the system. Similarly, if one of the air movers 106 disposed in the air mover pack housings 58 or 60 should fail the other air mover 106 would still operate to draw in air from its associated daughter board housing and expel the air from the rear end of the component enclosure 12. In that positive airflow is maintained throughout each section of the component enclosure 12, no flapper doors are needed to prevent reverse flow into the enclosure. The airflow within the enclosure is therefore not disrupted to a large degree when one of the air movers fails. Because of this fact, the data storage or other electrical devices to be cooled are prevented from overheating until such time when the inoperative air mover can be replaced. Moreover, due to the modular construction of the power supply modules 64 and the air mover packs 66, the entire sub-component containing the inoperative air mover can be quickly removed and replaced with the system online, thereby reducing system downtime.

While preferred embodiments of the invention have been disclosed in detail in the foregoing description and drawings, it will be understood by those skilled in the art that variations and modifications thereof can be made without departing from the spirit and scope of the invention as set forth in the following claims. In particular, it is to be understood that, although the air cooling system is described in reference to a data storage component, the air cooling system could be used in any electrical component which internally generates heat that must be dissipated.

Therefore, the following is claimed:

1. An electrical component having a hybrid air cooling system, said electrical component comprising:
   a component enclosure including front and rear ends and an air plenum that extends across the width of said component enclosure between said front and rear ends;
   a first removable module including at least two air movers arranged adjacent each other in series within said first removable module, said first removable module being insertable in a first lateral position downstream of said air plenum within said component enclosure; and
   at least one modular air mover pack including at least two air movers arranged adjacent each other in series within said at least one modular air mover pack, said at least one modular air mover pack being insertable in a second lateral position downstream of said air plenum within said component enclosure such that said first removable module is positioned in parallel with said at least one modular air mover pack when said removable module and said at least one modular air mover pack are placed within said component enclosure to provide both serial and parallel air flows within said component enclosure to dissipate heat generated therein.

2. The electrical component of claim 1, wherein said air movers of said first removable module are axial fans.

3. The electrical component of claim 1, wherein said air movers of said at least one air mover pack are centrifugal fans.

4. The electrical component of claim 1, further comprising a second removable module including at least two air movers arranged adjacent each other in series within said second removable module, wherein said first removable module is insertable along a first side of said component enclosure and said second removable module is insertable along a second side of said component enclosure such that said air movers of said first removable module, said second removable module, and said at least one modular air mover pack can be arranged in parallel within said component enclosure.

5. The electrical component of claim 4, wherein said first and second removable modules are power supply modules.

6. The electrical component of claim 1, wherein said at least one air mover pack is insertable along the center of said component enclosure.

7. An electrical component having a hybrid air cooling system, said electrical component comprising:
   a component enclosure including front and rear ends and an air plenum that extends across the width of said component enclosure between said front and rear ends;
   a first set of air movers arranged adjacent each other in series in a first lateral position downstream of said air plenum within said component enclosure; and
   a second set of air movers arranged adjacent each other in series in a second lateral position downstream of said air plenum within said component enclosure such that said first and second sets of air movers are positioned in parallel with each other within said component enclosure to provide both serial and parallel air flows within said component enclosure to dissipate heat generated therein.

8. The electrical component of claim 7, wherein said first set of air movers comprises at least two axial fans.

9. The electrical component of claim 8, wherein said at least two axial fans are mounted within a first removable module.

10. The electrical component of claim 7, wherein said second set of air movers comprises at least two centrifugal fans.

11. The electrical component of claim 10, wherein said at least two centrifugal fans are mounted within a modular air mover pack.

12. The electrical component of claim 7, further comprising a third set of air movers arranged adjacent each other in series in a third lateral position downstream of said air plenum within said component enclosure such that said first, second, and third sets of air movers are arranged in parallel within said component enclosure.

13. A hybrid air cooling system for use in an electrical component having a component enclosure including front and rear ends and an air plenum that extends across the width of the component enclosure between the front and rear ends, said air cooling system comprising:

a first set of air movers arranged adjacent each other in series, said first set of air movers being adapted to be positioned in a first lateral position within the component enclosure; and a second set of air movers arranged adjacent each other in series, said second set of air movers being adapted to be positioned in a second lateral position within the component enclosure such that said first and second sets of air movers are adapted to be arranged in parallel when said sets of air movers are positioned within the component enclosure to provide both serial and parallel air flow within the component enclosure to dissipate heat generated therein.

14. The system of claim 13, wherein said first set of air movers comprises at least two axial fans.

15. The system of claim 14, wherein said at least two axial fans are mounted within a first removable module.

16. The system of claim 13, wherein said second set of air movers comprises at least two centrifugal fans.

17. The system of claim 16, wherein said at least two centrifugal fans are mounted within a modular air mover pack.

18. The system of claim 13, further comprising a third set of air movers arranged adjacent each other in series, said third set of air movers being adapted to be positioned in a third lateral position downstream of the air plenum within the component enclosure such that said first, second, and third sets of air movers are arranged in parallel within the component enclosure.

19. A method of dissipating heat generated within an electrical component having a component enclosure including front and rear ends and an air plenum that extends across the width of the component enclosure between the front and rear ends, said method comprising the steps of:

providing a first set of air movers arranged adjacent each other in series in a first lateral position downstream, of the air plenum within the component enclosure; and providing a second set of air movers arranged adjacent each other in series in a second lateral position downstream of the air plenum within the component enclosure, wherein the first set of air movers is arranged in parallel with the second set of air movers within the component enclosure such that both serial and parallel air flow is provided within the component enclosure to dissipate heat generated therein.

20. The method of claim 19, further comprising the step of providing a third set of air movers arranged adjacent each other in series in a third lateral position downstream of the air plenum within the component enclosure, such that the first, second, and third sets of air movers are adapted to be arranged in parallel within said component enclosure.

* * * * *